United States Patent [19]

Nanjo

[11] Patent Number: 5,246,386

[45] Date of Patent: Sep. 21, 1993

[54] STRUCTURE FOR AND METHOD OF MAKING A TERMINAL PLUG

[75] Inventor: Hideo Nanjo, Okayama, Japan

[73] Assignee: Omron Corporation, Kyoto, Japan

[21] Appl. No.: 857,159

[22] Filed: Mar. 25, 1992

[30] Foreign Application Priority Data

Mar. 26, 1991 [JP] Japan ................................. 3-62159

[51] Int. Cl.$^5$ .......................................... H01R 13/04
[52] U.S. Cl. ..................................... 439/618; 29/846;
29/848; 439/931
[58] Field of Search ............... 439/617, 618, 692, 931;
29/843, 848, 852, 883, 885, 846

[56] References Cited

U.S. PATENT DOCUMENTS

| | | |
|---|---|---|
| 3,409,857 | 11/1968 | O'Neill et al. .......... 439/72 |
| 3,772,632 | 11/1973 | Rattcliff et al. ......... 439/73 |
| 4,872,844 | 10/1989 | Grebe et al. ............ 439/69 |
| 4,969,842 | 11/1990 | Davis ................. 439/629 |
| 4,977,668 | 12/1990 | McKenzie .............. 29/852 |
| 5,127,838 | 7/1992 | Zaderej et al. .......... 439/74 |

FOREIGN PATENT DOCUMENTS

| | | |
|---|---|---|
| 1167748A3 | 1/1986 | European Pat. Off. . |
| 2335029 | 7/1977 | France . |
| 2184298A | 6/1987 | United Kingdom . |

Primary Examiner—Neil Abrams
Attorney, Agent, or Firm—Fish & Richardson

[57] ABSTRACT

A structure for a terminal plug includes a thermoplastic resin base having a key boss and a plurality of protruding shafts formed integrally on a front side thereof. Terminal pins are formed on the plurality of protruding shafts by a chemical plating process. Connection patterns are disposed on the front side of the thermoplastic resin base and connected to said terminal pins, and circuit patterns are disposed on the back side of the thermoplastic resin base. A plurality of through-holes are formed in the thermoplastic resin base which electrically connect the connection patterns and the circuit patterns.

9 Claims, 4 Drawing Sheets

STRUCTURE FOR AND METHOD OF MAKING A TERMINAL PLUG

FIELD OF THE INVENTION

This invention relates to a structure for a terminal plug of an electronic device and a method of making the same.

BACKGROUND OF THE INVENTION

An oblique view of the structure of an existing terminal plug for an electronic device (a timer) is shown in FIG. 5. The terminal plug of this timer comprises resin thermoplastic base 73; key boss 71, which protrudes from the center of the front surface of the base; number of through-holes 72, which are arranged in a circle around the outer perimeter of the key boss; a number of metal pins 74, which are inserted in through-holes 72; and copper-clad laminate 75 (circuit pattern 75a), which is glued to the back of base 73. The base of each metal pin 74 is soldered to its corresponding pattern 75a on copper-clad laminate 75. To ensure isolation, base 73 has a slit 76 between every two pins 74. Each connector terminal 75b of these circuit patterns 75a is connected to a circuit pattern connector 78 on the inner surface of the upper and lower walls (77a and b) of the casing 77 which is assembled with base 73.

In existing terminal plugs for electronic devices (timers and so on), metal pins are insertion-molded into the base, and the base of each pin is soldered to the circuit pattern formed on a copper-clad laminate glued to the back of the base. As a result, a large number of components and assembly processes are needed. This has caused a sharp rise in production costs. Using insertion-molding is disadvantageous not only because of the high cost of the components, but also because of the high start-up costs associated with component production. Furthermore, in a terminal plug like that used in a timer, which has eleven poles (and eleven pins), it is difficult to provide isolation between every two pins. More specifically, it is difficult with this type of terminal plug to meet strict standards for isolation distance such as that specified by the VDE (The German Association of Electrical Engineers).

SUMMARY OF THE INVENTION

The invention overcomes the disadvantages of the prior art by providing a structure for a terminal plug of an electronic device which reduces the part count and the number of production processes, thus making the structure more economical, and which ensures proper isolation between the pins.

In light of above, according to a first embodiment the terminal plug of the invention comprises: a thermoplastic resin base having a key boss and a plurality of protruding shafts formed integrally on a front side thereof; terminal pins formed on said plurality of protruding shafts by a chemical plating process; connection patterns disposed on said front side of said thermoplastic resin base and connected to said terminal pins; and circuit patterns disposed on a back side of said thermoplastic resin base; wherein a plurality of through-holes are formed in said thermoplastic resin base which electrically connect said connection patterns and said circuit patterns.

To produce a terminal plug for an electronic device which has this type of structure, an engineering plastic with good heat resistance (for example, polyethyl sulfone) is used for the base. Injection molding can be used to create the key boss, the shafts and the base from a single piece of material. The surfaces of the shafts projecting from the base are chemically plated (with copper plating) so as to transform these shafts into metal pins (the terminal pins). A through-hole is provided in the resin thermoplastic base for each projecting shaft (terminal pin). A pattern is created by chemically plating (with copper plating) portions of the peripheral surface of the resin thermoplastic base, including all the terminal pins and through-holes. A circuit pattern corresponding to these patterned areas is formed on the back surface of the molded base by chemical plating (with copper plating). In this way every terminal pin is electrically connected to the circuit pattern by way of the patterned areas and through-holes. In other words, this terminal plug has a printed circuit which is chemically plated onto an injection-molded base. This design results in an economical terminal plug which requires very few components and which significantly reduces the number of production processes.

According to a second embodiment, the terminal plug of the invention comprises: a thermoplastic resin base having a key boss and a plurality of protruding shafts formed integrally on a front side thereof; terminal pins formed on said plurality of protruding shafts by a chemical plating process; connection patterns disposed on said front side of said thermoplastic resin base and connected to said terminal pins; and circuit patterns disposed on a back side of said thermoplastic resin base; wherein a plurality of through-holes ar formed in said thermoplastic resin base which electrically connect said connection patterns and said circuit patterns; and further comprising circuit pattern isolation means for isolating portions of said circuit patterns.

To produce an electronic device terminal in accordance with this embodiment, isolation ribs are injection-molded on the front and back surfaces of the resin thermoplastic base so that the base and the ribs are formed from a single piece of material. That is, protruding isolation ribs are formed on the surface of the base in a pattern of spokes or ray emanating radially from the key boss. Each patterned area is thus partitioned off by its isolation ribs, and each pattern is completely segregated. Each circuit pattern, including the end of the through-hole which comes out on the other side of the base, is also partitioned and segregated by the protruding ribs (the isolation ribs). A plug with eleven poles (and eleven pins) for a device such as a timer could thus have the space between every two terminal pins (and circuit patterns) walled off. Because the isolation ribs protrude from the surface of the base, neighboring pins (and neighboring patterned areas) can be partitioned and segregated from each other. Complete isolation can be maintained, and the design can meet even those standards which specify strict isolation distances.

DETAILED DESCRIPTION OF THE INVENTION

Figure 1:
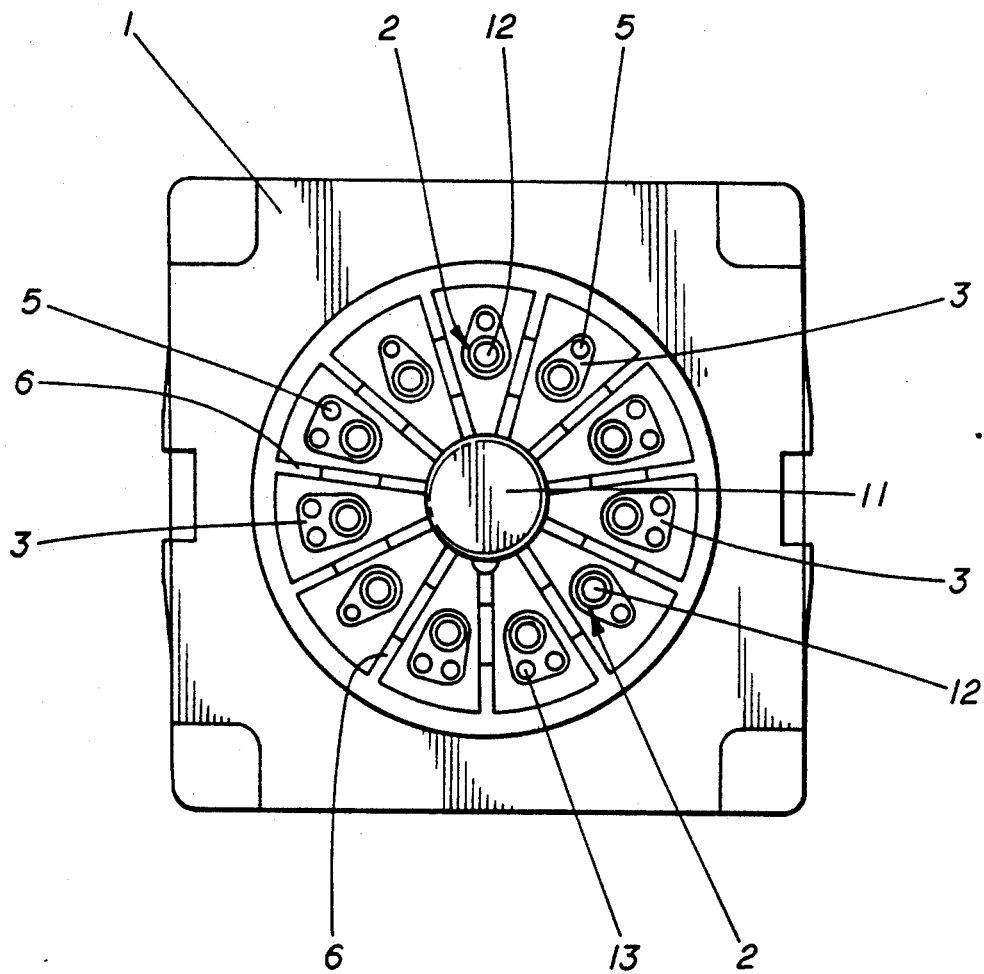
FIG. 1 is a bottom view of a terminal plug for an electronic device according to a preferred embodiment of the invention.

FIG. 1 shows an embodiment of the terminal plug of an electronic device of the invention. The electronic device pictured in the embodiment is a timer as an example.

The first terminal plug includes: resin thermoplastic base 1, a key boss 11 in its center, around the outer perimeter of which a number of protruding shafts 12, which are also formed from the same piece of resin thermoplastic, are arranged in a circle; terminal pins 2, which are created by applying a chemical plating process to the surface of protruding shafts 12; connection patterns 3 for terminal pins 2, which ar created by applying a chemical plating process to the area surrounding the base of each pin 2; a number of circuit patterns 4, which are created by applying a chemical plating process to the back of resin thermoplastic base 1 in the same areas as connection patterns 3; and electronical through-holes 5 to electrically connect the terminal pins 2 with circuit patterns 4.

Base 1 is injection-molded using an engineering plastic with good heat resistance (for example, polyethyl sulfone). Base 1 is flat and has mounting flanges along its periphery. Cylindrical key boss 11 projects from the center of the base, and eleven protruding shafts 12 are arrayed in a circle around key boss 11. All parts of base 1 are forced from a single piece of material. In general, one throughhole 5 is provided in the base for each protruding shaft 12. In the embodiment, an example is also shown in which two through-holes 5 are provided for one protruding shaft 12. Two through-holes would be used, for example, when the terminal is to be provided with a load. Because base 1 is forced by injection-molding, key boss 11, protruding shafts 12 and through-holes 5 can all be formed from a single piece of material.

All surfaces of protruding shafts 12 on base 1 are treated with chemical plating in order to transform shafts 12 into metal pins (or terminal pins) 2. After the chemical plating (which may, for example, be copper plating) is completed, the surface is treated with a protective nickel plating. The area surrounding the base of terminal pins 2, including the pins and through-holes 5, is chemically plated (with copper plating) to form connection patterns 3, and these patterns 3 are connected to terminal pins 2. Preferably, the terminal pins, the circuit patterns, and the plating on the through-holes are formed by a single plating operation.

Figure 2:
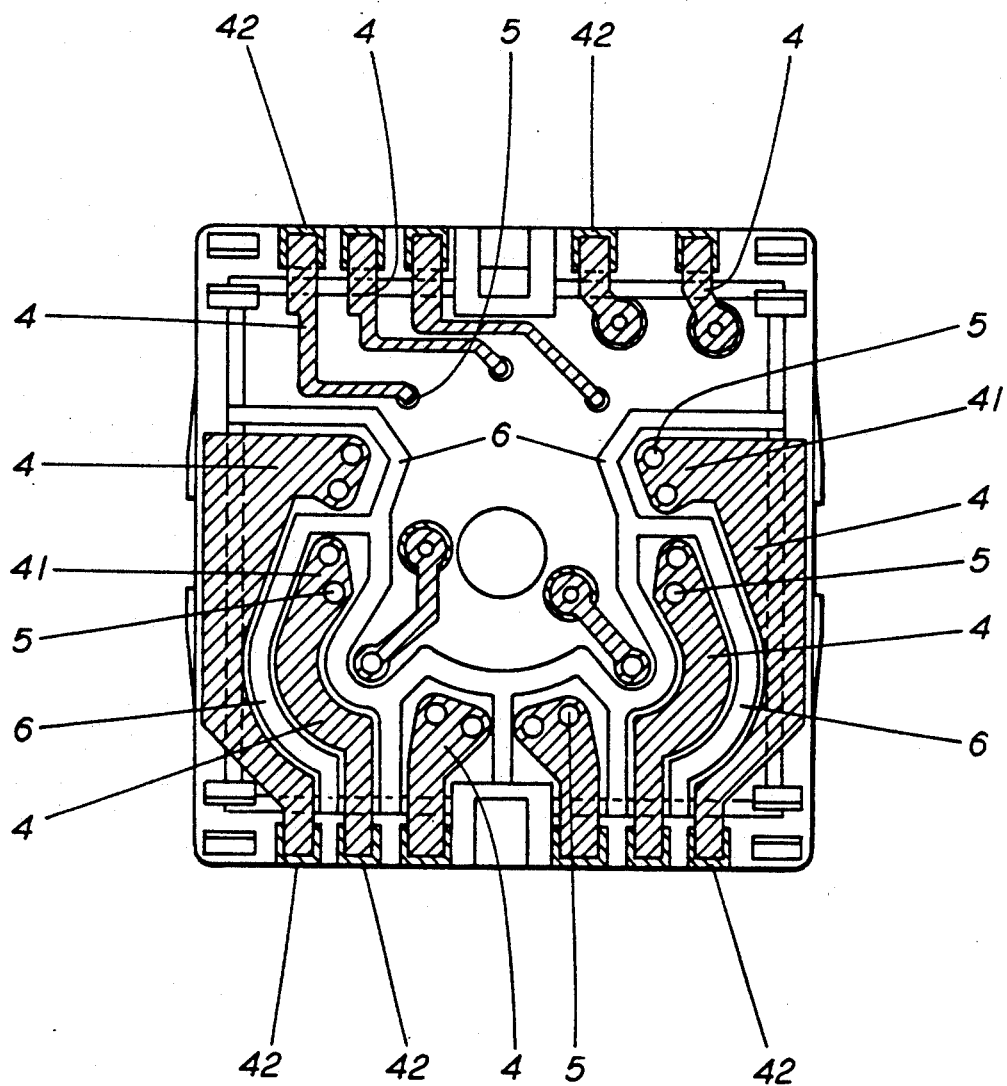
FIG. 2 is a top view of a terminal plug for an electronic device according to the preferred embodiment.
Figure 3:
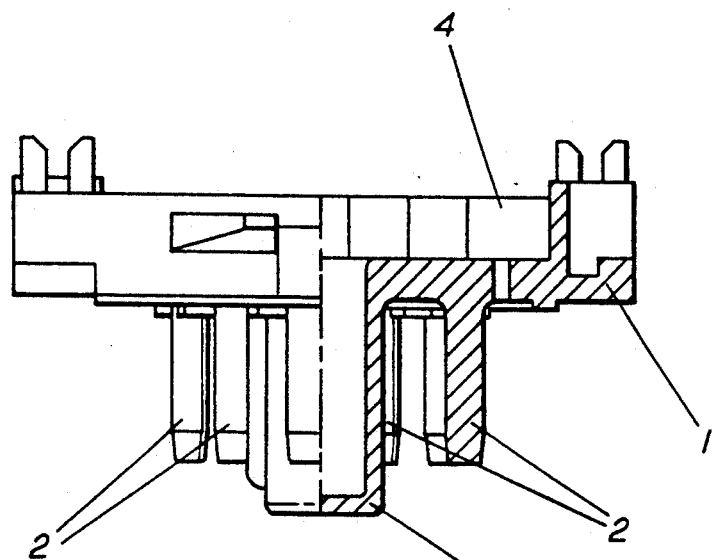
FIG. 3 is a partial cross-sectional view of a first side of the terminal plug according to the preferred embodiment.

As can be seen in FIG. 2, circuit patterns 4, which correspond to the connection patterns 3, are created on the back of base 1 by chemical plating (with copper plating). The through-holes 5 come out at one end (41) of each circuit pattern 4, and the other end (42) is the connector terminal. As can be seen in FIG. 3, electronical through-holes 5, which connect the terminal pins 2 with circuit patterns 4, are established by the placement of through-holes 5 in the base. In this way, each terminal pin 2 is electrically connected with its circuit pattern 4.

A terminal plug for an electronic device with this configuration is injection-molded as a single piece using a heat-resistant engineering plastic. It comprises a flat base 1, a key boss 11 and protruding shafts 12. The entire surface of each shaft 12 on base 1 are treated with chemical plating (copper plating) in order to create metal pins 2 (the terminal pins). Connection patterns 3 (of copper plating) are created on the surface of resin thermoplastic base 1 so as to encompass all terminal pins 2 and through-holes 5. A circuit pattern 4 (copper plating) is formed on the back of resin thermoplastic base 1 to correspond with each connection patters 3. In this way every terminal pin 2 is connected to a connection pattern 3, and electrically connected to a circuit pattern 4 through a electronical throughhole 5. In other words, this terminal plug has a printed circuit which is chemically plated onto an injection-molded base. This design results in an economical terminal which requires very few components and which significantly reduces the number of production processes.

Figure 4:
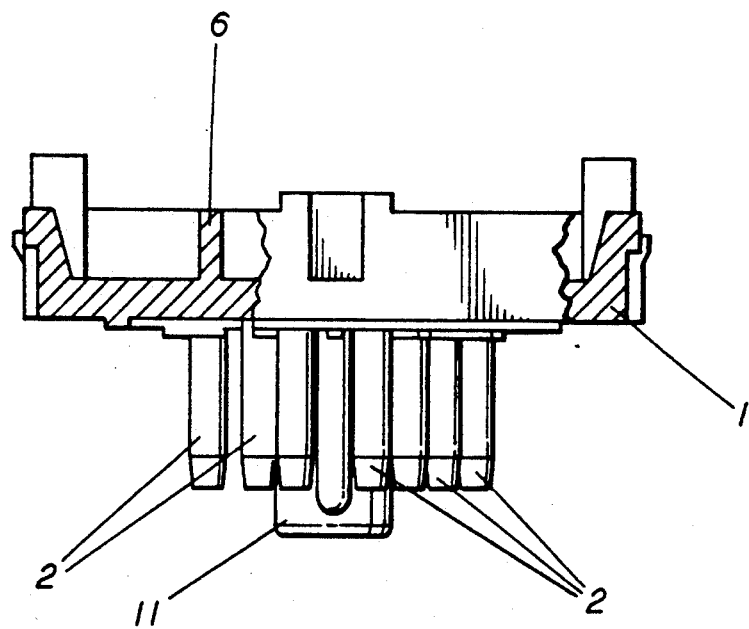
FIG. 4 is a partial cross-sectional view of a second side of the terminal plug according to the preferred embodiment.
Figure 5:
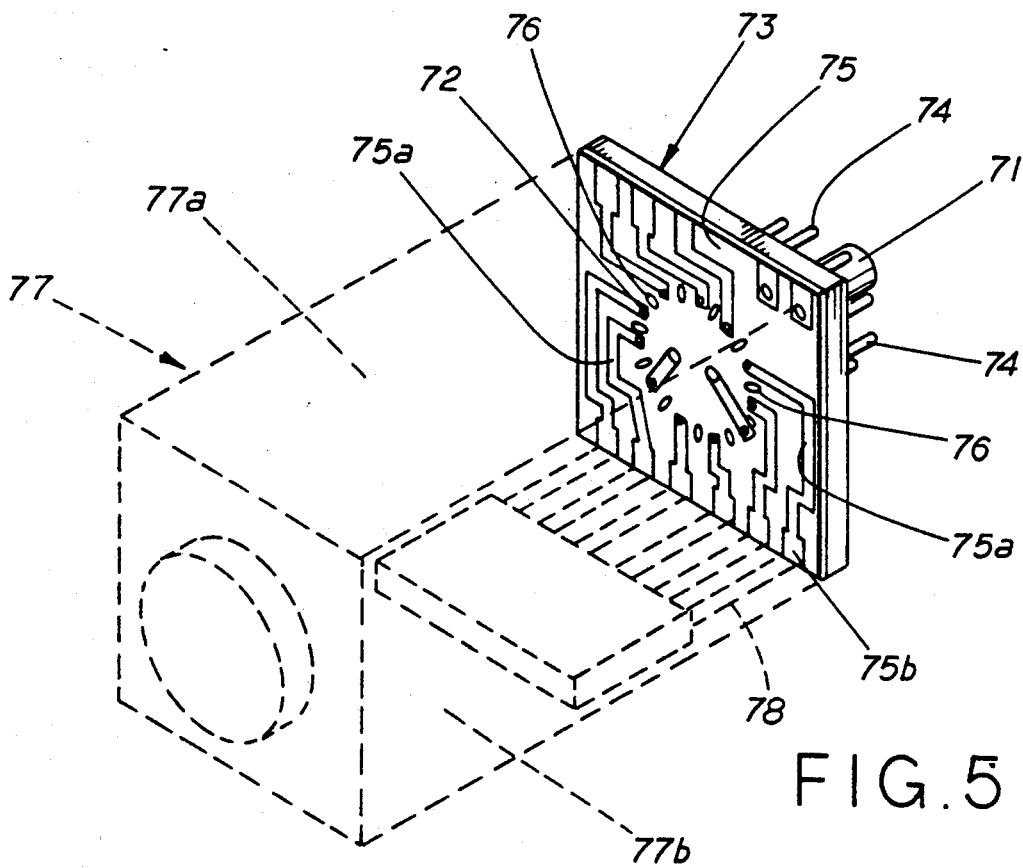
FIG. 5 is an oblique view showing an existing terminal plug for an electronic device.

According to a second embodiment, the terminal plug is provided with protruding isolation ribs 6 on both the front and back of the resin thermoplastic base 1 to partition each of the connection pattern 3 and circuit patterns 4 from the others. As is shown in FIGS. 1 and 2, isolation ribs 6 are injection-molded on the front and back surfaces of resin thermoplastic base 1 so as to be of a single piece with the base. These protruding isolation ribs 6 are formed on the surface of base 1 in a pattern of spokes or rays emanating from key boss 11. Each connection patterns 3 are thus partitioned off by its isolation ribs 6, and each pattern is completely segregated. As is shown in FIGS. 2 and 4, each circuit pattern 4, including the end of the electronical throughhole 5 which comes out on the other side of base 1, is also partitioned and segregated by the protruding ribs 6 (the isolation ribs).

It is especially practical to use this kind of isolation ribs in devices such as timers which have many pins in small area. This is because isolation ribs 6 protrude from the surface of the base, and every pin 2 and every circuit pattern 5 can be completely walled off and segregated. This makes possible the design to meet even those standards which specify strict isolation distances.

Figure 6:
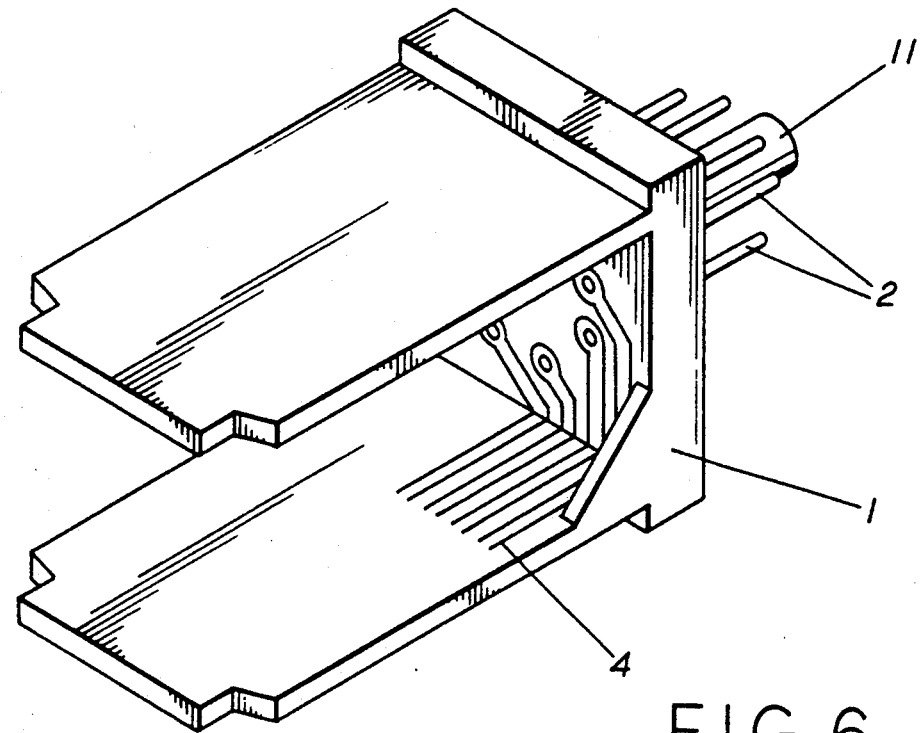
FIG. 6 is a perspective view according to another embodiment of the invention.

In above embodiments, an example was used in which base 1 was a flat panel. However, it would also be acceptable for base 1 to be formed as shown in FIG. 6 with the base socket on one side and pair of continuous printed circuit boards extending in opposed relation from the other side. In this case, the base and the printed circuit boards would be formed of one substantially U shaped piece. In addition, the circuit patterns would be formed in one plating step to extend from the through-holes onto the printed circuit boards.

As mentioned above, the first embodiment provides an economically-priced terminal which requires very few components and which significantly reduces the number of production processes. The second embodiment additionally ensures isolation of the circuit patterns.

While there are shown and described present embodiments of the invention, it is to be distinctly understood that the invention is not limited thereto, but may be otherwise variously embodied and practiced within the scope of the following claims.

What is claimed is:

1. A structure of a terminal plug, comprising:

a thermoplastic resin base having a key boss and a plurality of protruding shafts formed integrally on a front side thereof;

terminal pins formed on said plurality of protruding shafts by a chemical plating process;

connection pattern disposed on said front side of said thermoplastic resin base and connected to said terminal pins, said connection patterns being formed by said chemical plating process;

a plurality of protruding isolation ribs formed on said front side of said thermoplastic resin base for electrically isolating said connection patterns; and circuit patterns disposed on a back side of said thermoplastic resin base;

wherein a plurality of through-holes are formed in said thermoplastic resin base which electrically connect said connection patterns and said circuit patterns.

2. A structure as claimed in claim 1, wherein said key boss is disposed centrally with respect to said plurality of protruding shafts.

3. A structure as claimed in claim 1, wherein said thermoplastic resin base, said key boss and said plurality of protruding shafts are formed integrally by injection molding.

4. A structure as claimed in claim 1, wherein said plurality of protruding isolation ribs are formed radially on said front side of said thermoplastic resin base.

5. A structure as claimed in claim 1, further comprising circuit pattern isolation means for isolating portions of said circuit patterns.

6. A structure as claimed in claim 5, wherein said circuit pattern isolation means comprises a plurality of protruding isolation ribs formed on the back side of said thermoplastic resin base.

7. A method of making a terminal plug, comprising the steps of:

forming a thermoplastic resin base having a plurality of through-holes extending therethrough and a key boss and a plurality of shafts protruding from a front side thereof;

forming terminal pins on said plurality of protruding shafts and connection patterns on the front side of said thermoplastic resin base by a plating process, said connection patterns being connected to said terminal pins and extending to said through-holes;

forming circuit patterns on a back side of said thermoplastic resin base cooperating with said through-holes; and plating said through-holes to electrically connect said connection patterns and said circuit patterns.

8. A method as claimed in claim 7, wherein the terminal pins, the connection patterns, and the plating on the through-holes are formed by a single plating process.

9. A method as claimed in claim 7, wherein said thermoplastic resin base, said key boss and said plurality of shafts are formed in one piece by injection molding.

* * * * *